United States Patent
Seo et al.

(10) Patent No.: US 6,861,327 B2
(45) Date of Patent: Mar. 1, 2005

(54) METHOD FOR MANUFACTURING GATE SPACER FOR SELF-ALIGNED CONTACT

(75) Inventors: June Seo, Gyeonggi-do (KR); Jong-Heui Sing, Gyeonggi-do (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 0 days.

(21) Appl. No.: 10/044,799

(22) Filed: Jan. 10, 2002

(65) Prior Publication Data

US 2002/0115249 A1 Aug. 22, 2002

(30) Foreign Application Priority Data

Jan. 11, 2001 (KR) .......................... 2001-1572

(51) Int. Cl.[7] .............................. H01L 21/331
(52) U.S. Cl. .................. 438/364; 438/99; 438/257; 438/229; 438/230; 438/299; 438/595; 438/364; 257/900
(58) Field of Search .................. 438/364, 99, 184, 438/257, 229–230, 299, 725, 595, 666, 696, 723, 734; 257/900, 314–315

(56) References Cited

U.S. PATENT DOCUMENTS

| | | | | |
|---|---|---|---|---|
| 4,755,478 A | * | 7/1988 | Abernathey et al. ........ | 438/296 |
| 6,057,581 A | * | 5/2000 | Doan ........................... | 257/401 |
| 6,121,129 A | * | 9/2000 | Greco et al. ................. | 438/622 |
| 6,140,192 A | * | 10/2000 | Huang et al. ............... | 438/305 |
| 6,268,252 B1 | * | 7/2001 | Lee et al. .................... | 438/299 |
| 6,303,953 B1 | * | 10/2001 | Doan et al. ................. | 257/296 |
| 6,355,524 B1 | * | 3/2002 | Tuan et al. .................. | 438/257 |
| 6,355,547 B1 | * | 3/2002 | Lee et al. .................... | 438/586 |
| 6,376,351 B1 | * | 4/2002 | Tsai ............................. | 438/592 |
| 6,475,922 B1 | * | 11/2002 | Zheng ......................... | 438/725 |
| 2001/0015455 A1 | * | 8/2001 | Hsieh et al. ................. | 257/315 |
| 2002/0000601 A1 | * | 1/2002 | Choi ........................... | 257/314 |

* cited by examiner

*Primary Examiner*—Matthew Smith
*Assistant Examiner*—Granvill D. Lee, Jr.
(74) *Attorney, Agent, or Firm*—Marger Johnson & McCollom, P.C.

(57) ABSTRACT

A method for manufacturing a gate spacer for self-aligned contacts is provided. A gate stack is formed on a semiconductor substrate. A conformal dielectric layer is then formed over the gate stack. An etch-stop material layer, e.g., a photoresist layer, is formed over the conformal dielectric layer. Next, an upper portion of the etch stop material layer is removed to expose an upper portion of the conformal dielectric layer by techniques such as etching back. Subsequently, the exposed conformal dielectric layer is etched back using the remaining etch-stop material layer as an etch stopper. The remaining etch-stop material layer is removed and the etched-back conformal dielectric layer is again etched back to form a gate spacer.

9 Claims, 7 Drawing Sheets

METHOD FOR MANUFACTURING GATE SPACER FOR SELF-ALIGNED CONTACT

This application claims the benefit of Korean Patent Application No. 2001-1572, filed on Jan. 11, 2001, under 35 U.S.C. § 119, the entirety of which is hereby incorporated by reference.

BACKGROUND OF THE INVENTION

1. Field of the Invention

The present invention generally relates to semiconductor device fabrication and, more particularly, to methods for manufacturing a gate spacer for self-aligned contacts.

2. Description of the Related Art

Figure 1:
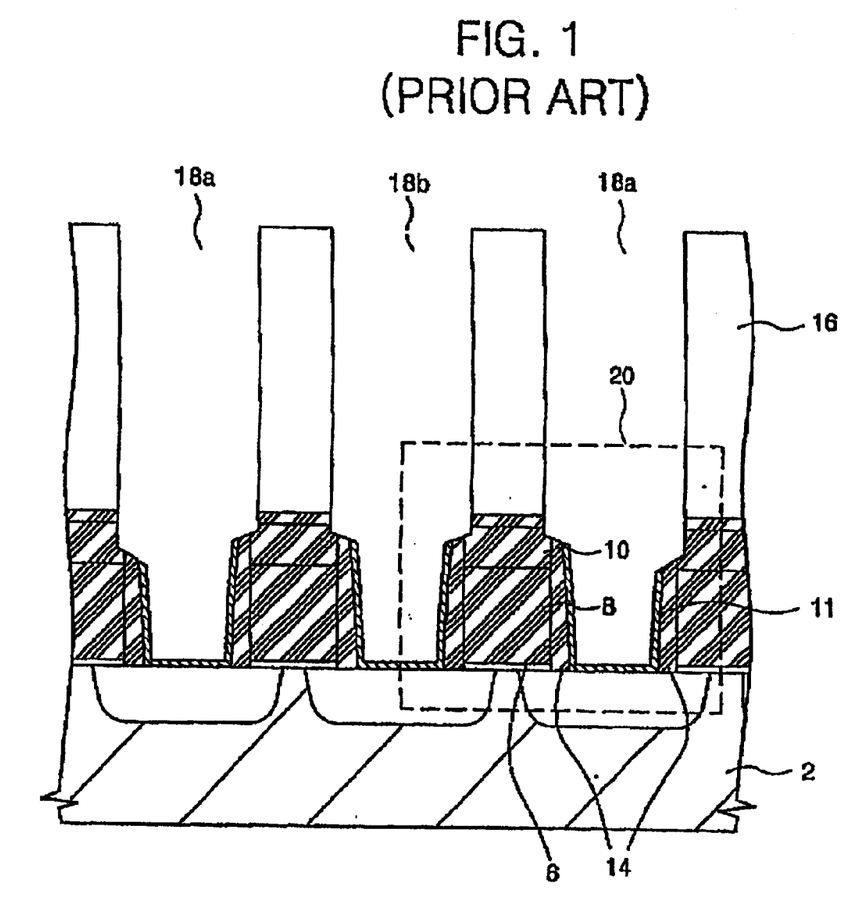
FIG. 1 is a cross sectional view illustrating a storage electrode contact hole and a bit line contact hole of a cell array region in a semiconductor memory device, taken along the direction parallel to bit lines.

FIG. 1 is a cross sectional view, illustrating a storage electrode contact hole (18a) and a bit line contact hole (18b), exposing a blanket etch stop layer 11 in a cell array region of a semiconductor memory device, taken along a direction parallel to bit lines (not shown). The storage-electrode contact hole (18a) and a bit line contact hole (18b) are typically formed using a self-aligned contact (SAC) process. Thus, the SAC process can be used for forming contact pads, which in turn form another contact for conductive lines in the subsequent processing steps.

This conventional SAC process uses a hard mask (10) and a gate spacer (14), which are formed of a dielectric material such as silicon nitride having high etching selectivity with respect to an interlayer insulating layer (16) formed of a dielectric material such as oxide. Because the hard mask (10) and the gate spacer (14) are formed of a material having high etching selectivity, i.e. a slower etch rate than the material used for the interlayer insulating layer (16), the SAC process selectively etches the interlayer insulating layer (16) between gate structures at a faster rate than it etches the gate spacer (14) and the hard mask (10). Thus, the contact holes (18a, 18b) can be formed even when a photoresist pattern defining the contact holes is not precisely aligned.

Figure 2A:
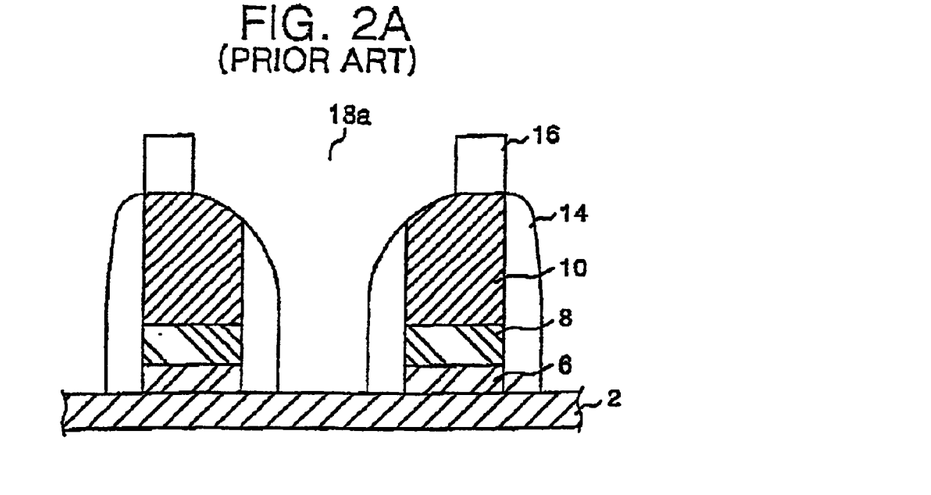
FIG. 2A is a cross sectional view illustrating the shape of an etched prior art gate spacer and a self-aligned contact hole after a SAC etching process.

FIG. 2A illustrates the shape of conventional gate spacer (14) formed of a dielectric material such as a silicon nitride, after a self-aligned contact hole 18a is formed in the interlayer insulating layer (16) using the SAC process. As semiconductor devices continuously scale down, very fine patterns are formed in semiconductor devices. Thus, the aspect ratio of contact holes is increased and the etching margin of the SAC process is significantly reduced. Further, the spacing between contact holes is smaller than that between a pair of facing gate electrodes, which results in defects such as pad bridges.

Figure 2B:
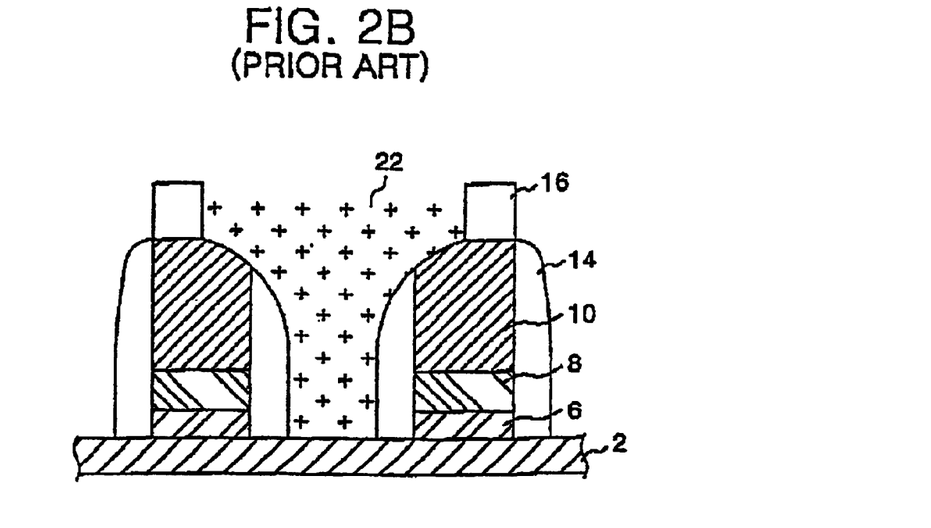
FIGS. 2B and 2C are cross sectional views of the conductive material formed within the conventional SAC contact hole, and a contact pad formed within the SAC contact hole using the prior art gate spacer.
Figure 2C:
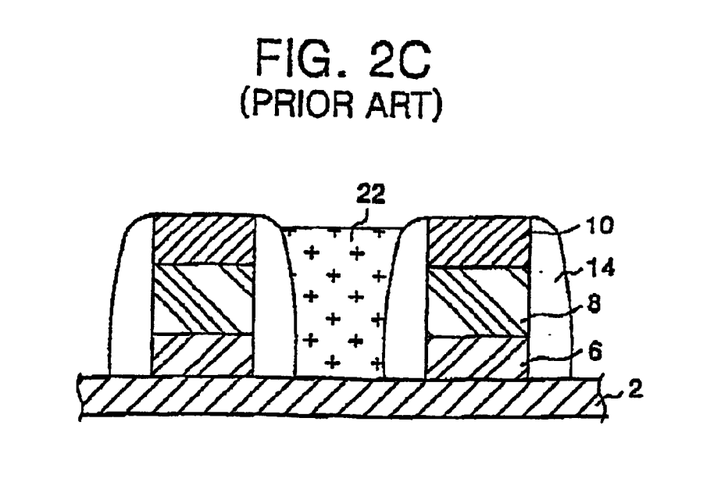

To solve the above-mentioned problems, recently, in the SAC process, a polysilicon layer on the top of a gate stack is removed by a chemical mechanical polishing (CMP) process to separate nodes, as illustrated in FIG. 2B and FIG. 2C.

However, such a SAC process typically requires overpolishing during the CMP process, resulting in a loss of the polysilicon layer as illustrated in FIG. 2C. Additionally, if more polysilicon layer is lost in the subsequent cleaning process, the size of the pad contact hole is further reduced, substantially degrading device characteristics.

SUMMARY OF THE INVENTION

To overcome the above-described problems, the present invention provides a method for manufacturing a novel gate spacer for a self-aligned contact enlarging the size of the pad contact hole and improving the SAC process margin.

According to one embodiment of the present invention, a gate stack is formed on a semiconductor substrate. A conformal dielectric layer is then formed over the gate stack. An etch-stop material layer, e.g., a photoresist layer, is formed over the conformal dielectric layer. Next, an upper portion of the etch-stop material layer is removed to expose an upper portion of the conformal dielectric layer by techniques such as etching back. Subsequently, the exposed conformal dielectric layer is etched back using the remaining etch-stop material layer as an etch stopper. The remaining etch-stop material layer is then removed. Finally, the etched-back conformal dielectric layer is etched back to form a gate spacer.

As a result, the etching process margin of the contact formation process can be increased and the size of the pad contact hole can be increased lengthwise. Further, an aspect ratio of the contact hole can be reduced.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION

Reference will now be made in detail to preferred embodiments of the present invention, example of which is illustrated in the accompanying drawings. Like reference numerals denote like parts in diagrams shown in the present invention.

FIG. 3a to FIG. 3f illustrate a method for manufacturing a gate spacer for the SAC process according to an embodiment of the present invention.

Figure 3A:
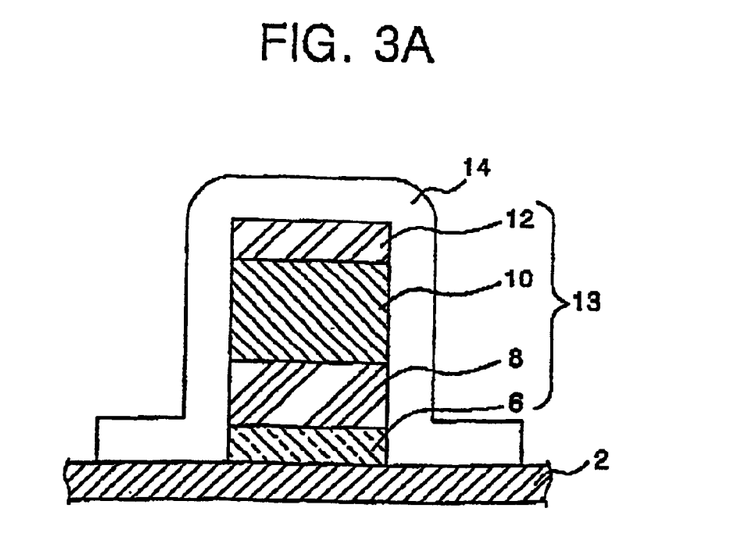
FIG. 3A to FIG. 3F illustrate a method for manufacturing a gate spacer for a SAC process according to an embodiment of the present invention.

In FIG. 3a, a gate stack (13) is formed on a semiconductor substrate such as a silicon substrate (2). The gate stack (13) includes a gate dielectric layer (6), a gate electrode (8), a hard mask (a capping layer) or a gate mask (10), a patterned oxide layer (12), which are formed using conventional techniques. The gate electrode (8) preferably comprises a polycide layer, e.g., a layer comprising a polysilicon layer and a tungsten silicide layer (WSi). Preferably, the polysilicon layer and the tungsten silicide layer are formed to a thickness of approximately 1000 Å and 1500 Å, respectively.

The hard mask (10) preferably comprises a silicon nitride (SixNy) with the patterned oxide layer (12) stacked thereon. The hard mask (10) and the patterned oxide layer (12) are preferably about 1500 Å and 1000 Å, respectively.

After the gate stack (13) is formed, a conformal dielectric layer (14) is deposited over the gate stack (13) to a thickness of about 700 Å, as shown in FIG. 3A. The conformal dielectric layer, e.g., a gate spacer layer (14) preferably comprises silicon nitride.

Figure 3B:
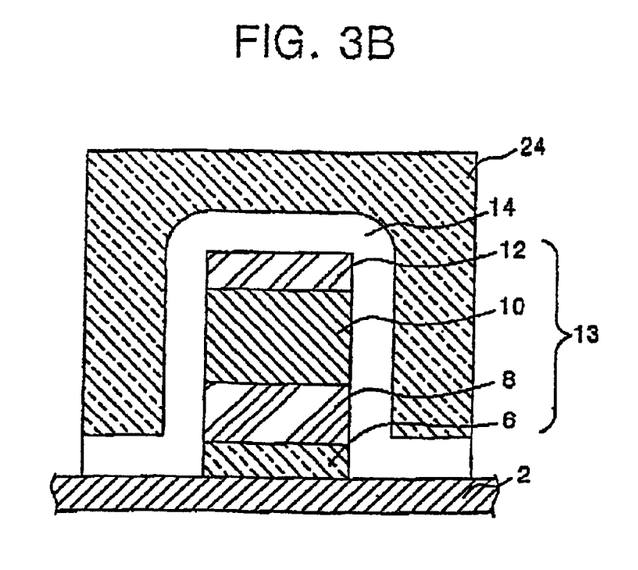

Referring to FIG. 3B, a photoresist layer (24) is then deposited over the gate spacer layer (14). The photoresist layer (24), formed of an organic material, is preferably formed to a thickness of more than 1000 Å. A person skilled in the art will appreciate that other organic materials having similar properties and suitable for this invention can be substituted for the photoresist layer (24).

Figure 3C:
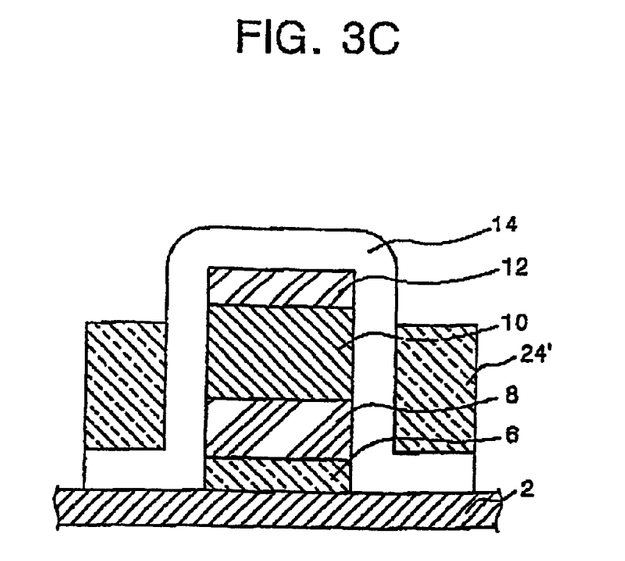

Now referring to FIG. 3C, an etch back process is performed on the photoresist layer (24) to remove an upper portion of the photoresist layer (24) and to expose a top portion of the gate spacer layer (14). As a result, the photoresist layer (24) is remained as a remaining photoresist layer (24'), and the gate space layer (14) is remained as an etched-back gate spacer layer (14') in accordance with an embodiment of the present invention. The top portion of the gate spacer (14") is preferably at least 400 Å higher than the top surface of the gate electrode (8) in subsequent processing steps. Preferably, this photoresist etching process uses TCP equipment and a gas mixture of $SF_6$, $CF_4$, $O_2$ and HBr.

Figure 3D:
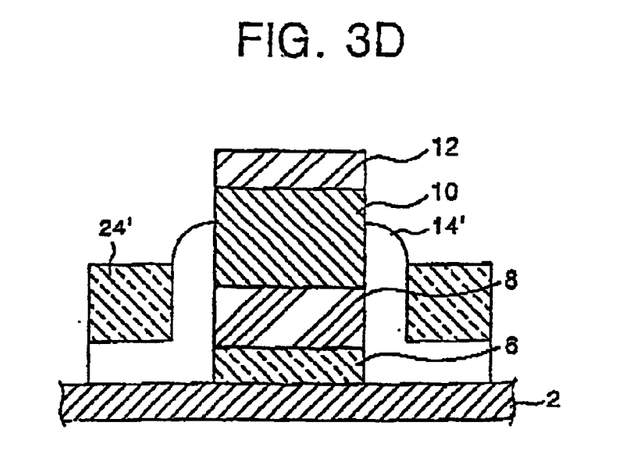

Referring to FIG. 3D, an etch back process is performed on the exposed gate spacer layer (14) to formed an etched-back gate spacer layer (14') using the remaining photoresist layer (24') as an etch stopper as mentioned above.

Figure 3E:
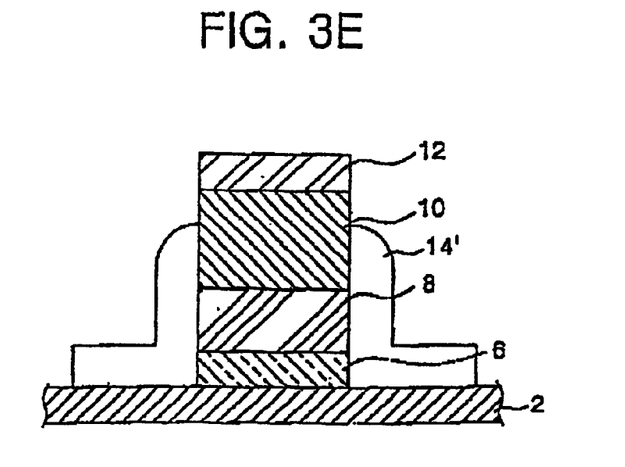

Referring to FIG. 3E, the remaining photoresist layer (24') is removed by conventional techniques such plasma ashing and stripping and thus the etched-back gate spacer layer (14') is substantially fully exposed.

Figure 3F:
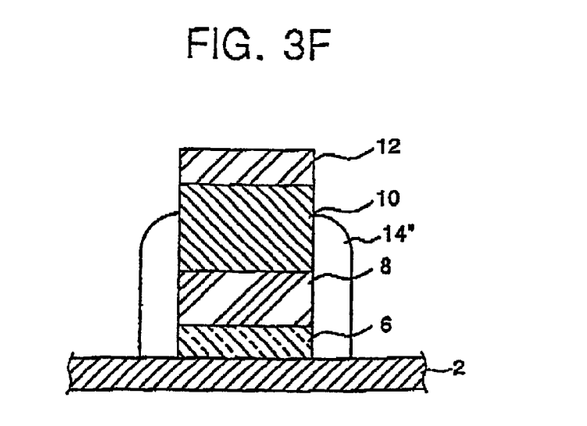

Referring to FIG. 3F, the etched-back gate spacer layer (14') is again etched back to form a gate spacer (14") on the sidewalls of the gate stack (13). Consequently, the gate spacer (14") or the gate spacer shoulder has a shoulder substantially lower than the top surface of the hard mask (10) and at least more than 400 Å above from the top surface of the gate electrode (8).

A blanket etch stop layer (not shown) is formed overlying the gate stack (13) and the silicon substrate (2) for a SAC process. This blanket etch stopper layer protects the silicon substrate 2 and device isolation regions (not shown) from etchants during the SAC process.

Then, an interlayer insulating layer (16) such as a BPSG (Boron Phosphorus Silicate Glass) layer is deposited over the gate stack (13) to a thickness of, for example, approximately 9500 Å.

Figure 4A:
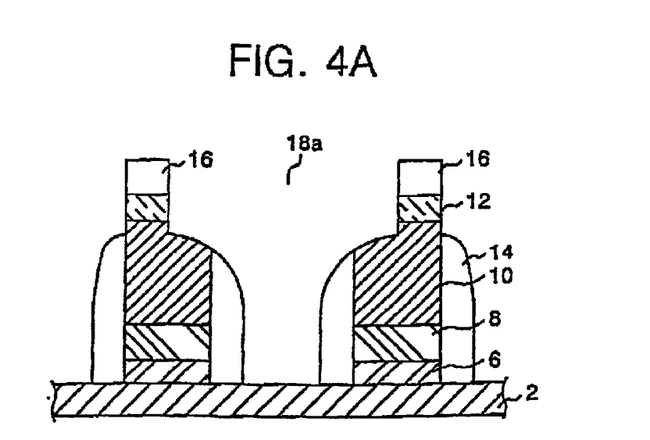
FIG. 4A is a cross sectional view illustrating a SAC contact hole formed using a novel gate spacer according to an embodiment of the present invention.

Next, as shown in FIG. 4A, the SAC process is performed to form a SAC contact hole (18a) within the interlayer insulating layer (16) between the gate stacks (13) using the blanket etching stop layer (not shown), the gate spacer (14) and the hard mask (10), as an etch stopper. It is desirable that the loss of the oxide layer (12) and the hard mask (10) be minimal during the SAC process. Thus, the SAC contact hole (18a) according to an embodiment of the present invention has a shoulder lower than that of the conventional process.

Figure 4B:
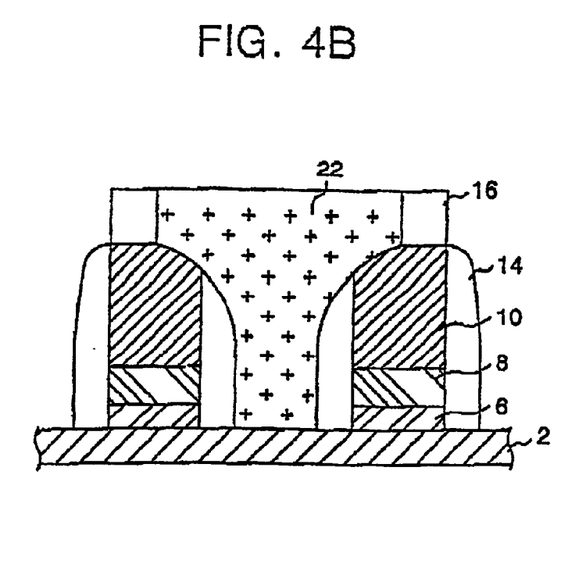
FIGS. 4B and 4C are cross sectional views of the conductive material formed within the SAC contact hole, and a contact pad formed within the SAC contact hole according to an embodiment of the present invention.
Figure 4C:
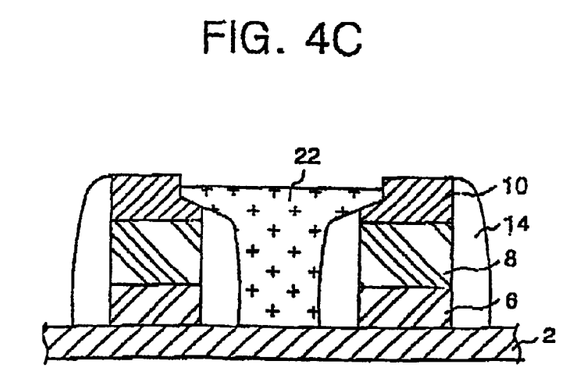

As show in FIG. 4B, subsequently, the SAC contact hole (18a) is filled with a conductive material (22). Then, as shown in FIG. 4C, a CMP process is performed on the resulting structure including the conductive material to form contact pads.

As a result, the etching process margin of the contact formation process can be increased and the size of the pad contact hole can be increased lengthwise. Further, an aspect ratio of the contact hole can be reduced.

According to an embodiment of the present invention, it is desirable that, firstly, a recess in a silicon substrate maintain in the present level during the formation of a spacer by etching; secondly, the loss of an oxide be minimized during the formation of the silicon nitride (SixNy) spacer by etching; finally, the oxide on the gate mask remain during the SAC etching and the etch stop layer (SixNy) etching.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for manufacturing a gate spacer for self-aligned contacts comprising:

forming a gate stack on a semiconductor substrate;

forming a conformal dielectric layer over the gate stack;

applying an etch-stop material layer over the conformal dielectric layer;

removing an upper portion of the etch-stop material layer to expose an upper portion of the conformal dielectric layer;

etching back the exposed conformal dielectric layer;

removing the remaining etch-stop material layer; and etching back the etched-back conformal dielectric layer to form a gate spacer.

2. The method of claim 1, wherein the gate stack comprises a gate dielectric, a gate electrode, a hard mask, and a patterned oxide layer.

3. The method of claim 2, wherein a top surface of the gate spacer is substantially lower than that of the hard mask.

4. The method of claim 1, wherein a top portion of the gate spacer is approximately 400 Å higher than that of the gate electrode.

5. The method of claim 1, wherein the etch-stop material layer comprises an organic material.

6. The method of claim 5, wherein the etch-stop material layer is a photoresist layer.

7. The method of claim 6, wherein removing the photoresist layer comprises etching the photoresist layer using a gas mixture of SF6, CF4, O2 and HBr.

8. The method of claim 1, wherein the etch-stop material layer is used as an etch stopper during etching of the exposed conformal dielectric layer.

9. The method of claim 1, wherein a thickness of the etch-stop material layer is more than approximately 1000 Å.

* * * * *

UNITED STATES PATENT AND TRADEMARK OFFICE
CERTIFICATE OF CORRECTION

PATENT NO. : 6,861,327 B2
DATED : March 1, 2005
INVENTOR(S) : Seo et al.

It is certified that error appears in the above-identified patent and that said Letters Patent is hereby corrected as shown below:

<u>Title page,</u>
Item [75], Inventors, replace "June Seo" with -- Jun Seo --.

Signed and Sealed this

Twenty-first Day of March, 2006

JON W. DUDAS
*Director of the United States Patent and Trademark Office*